United States Patent
Pettersson

(10) Patent No.: US 6,388,851 B1
(45) Date of Patent: May 14, 2002

(54) ELECTRONIC DISCHARGE PROTECTION OF INTEGRATED CIRCUITS

(75) Inventor: Ola Pettersson, Järfalla (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/499,360

(22) Filed: Feb. 8, 2000

(30) Foreign Application Priority Data

Feb. 9, 1999 (SE) .............................................. 9900439

(51) Int. Cl.$^7$ ................................................ H02H 9/00
(52) U.S. Cl. ......................................... 361/56; 257/355
(58) Field of Search ........... 361/56, 91.1; 257/355–359

(56) References Cited

U.S. PATENT DOCUMENTS

| | | | |
|---|---|---|---|
| 4,710,791 A | 12/1987 | Shirato et al. | 361/56 |
| 4,730,208 A | 3/1988 | Sugino et al. | 357/23.11 |
| 4,806,999 A | 2/1989 | Strauss | 357/23.13 |
| 4,876,584 A | 10/1989 | Taylor | 357/23.13 |
| 5,196,913 A | 3/1993 | Kim et al. | 357/23.13 |
| 5,304,839 A | 4/1994 | Chen et al. | 257/355 |
| 5,432,368 A | 7/1995 | Jimenez | 257/355 |
| 5,468,993 A | 11/1995 | Tani | 257/676 |
| 5,514,892 A | 5/1996 | Countryman et al. | 257/355 |
| 5,615,073 A | 3/1997 | Fried et al. | 361/56 |
| 5,748,425 A | 5/1998 | Gutsch et al. | 361/56 |
| 5,808,343 A | 9/1998 | Pilling et al. | 361/56 |
| 5,821,572 A | 10/1998 | Walker et al. | 257/107 |

FOREIGN PATENT DOCUMENTS

| | | | |
|---|---|---|---|
| EP | 0371663 A1 | 6/1990 | H01L/24/02 |
| EP | 0 822 596 A2 | 2/1998 | H01L/27/02 |
| JP | 8018007 | 1/1996 | H01L/27/04 |

*Primary Examiner*—Ronald W. Leja
(74) *Attorney, Agent, or Firm*—Nixon & Vanderhye P.C.

(57) ABSTRACT

Electrical connection pads for integrated semiconductor circuits have a protective diode formed by a doped region located in a well of opposite doping and another protective diode formed by a well which surrounds another doped region of the same doping type as a contact area and is surrounded by another well of oppositive doping. The doped regions are connected to the pad and are continuous. Narrow strips extend at or along a portion of the periphery of the pad. Also, the well for which the other doped region serves as a contact, has a strip-shape and is located at the periphery of the pad. The other doped region is also used as a contact for forming an electrical resistor connected to an input/output path of the integrated circuit. The resistor is formed in the well surrounding the other doped region. Another contact of the resistor is formed by a further doped region of the same doping type, also having a strip-shape and located in the same well at the periphery of the pad and beneath a marginal portion of the pad. The resistor thereby does not require any extra space.

29 Claims, 3 Drawing Sheets

ELECTRONIC DISCHARGE PROTECTION OF INTEGRATED CIRCUITS

The present invention relates to integrated circuits, in particular to electrostatic discharge protection of integrated circuits and to contact pads used in integrated circuits.

BACKGROUND

Electrostatic discharges (ESD) may, as is well known, damage electronic devices, particularly electronic semiconductor devices fabricated on insulating or semi-insulating substrates, such as particularly the kind of devices called integrated circuits. Devices for protecting against ESDs are conventionally incorporated in the input/output paths of most semiconductor devices in order to shunt excessive charge away from the sensitive circuits. In an integrated circuit chip, large metal areas called pads are provided which have free surfaces and area used for connecting the electronic circuits to other electrical devices, i.e., for input to and output from the electronic circuits of a chip. For example, electrically conducting wires can be bonded to such pads. Then ESD protection circuits may be located at and connected to such pads.

When making a connection to a pad, such as a wirebond connection, the downward forces can have a considerable magnitude and can cause delamination of layers below the pad, in particular if metal layers exist there. The forces can also damage pn-junctions located in that area. Thus, electronic circuits such as the ESD circuits cannot easily be located below or straightly under the pad, though such a location of some circuits would generally be advantageous since it would save a significant useful area of the chip of the integrated circuit.

In U.S. Pat. No. 5,514,892, an electrostatic discharge protection device is disclosed having diodes formed in semiconducting wells below a wirebond pad. The pad is through one diode connected to ground and through five diodes connected in series to a supply voltage of 3 V. By the provision of the latter diodes connected in series the integrated circuit is tolerant to 5 V. The diodes are formed below the pad in a pattern having six rectangular areas located in row. This construction, probably especially the particular layout of an intermediate connecting metal layer, is claimed to eliminate the problem of interlayer delamination.

In U.S. Pat. No. 4,750,081, an electrostatic discharge protection circuit is disclosed having diodes located directly beneath the rectangular corners of a wirebond pad. Also, discrete diodes may be formed directly beneath the perimeter or the marginal portion of the pad in a row between the corner diodes, the longitudinal extension of these other diodes being perpendicular to the sides of the pad. The major portion of the pad will thus have no metal layers therebelow, reducing the risk of delamination. Only diodes of a single orientation type are used connecting the metal pad to the substrate by a reverse-biased pn-junction. A protective structure is disclosed in U.S. Pat. No. 5,304,839, the structure not including any resistor in the input or output path.

In input paths of semiconductor devices, often some protection to high input currents is provided, such as an electrical resistance connected in the input path, this resistance limiting the input current. This resistance is conventionally located outside the bonding pad and then occupies some valuable chip area, as is illustrated by the documents cited below.

In U.S. Pat. No. 4,806,999 input pads are protected from electrostatic discharge by two diodes located under the periphery of the pad. The protective diodes are formed by first electrodes connected to the pad and having shapes of relatively narrow strips extending along substantially half the periphery or edge line of the pad. The first electrodes are located connected to or in tubs or wells, which have doping types opposite those of the first electrodes and which form the second electrodes of the diodes and which are intended to be connected to a supply drive voltage or ground. The boundary between the tubs are located in a region not overlaid by the exposed portion of the pad. An input resistor can be included between the pad and the input circuitry.

In U.S. Pat. No. 4,876,584 an integrated circuit is disclosed having terminal pads protected by diodes and transistors. The diodes and transistors are placed horizontally outside the respective pads and have one terminal located at the edge of the pads. A resistor is provided by a resistive path connecting a pad to the remainder of the integrated is circuit. A similar structure having protective diodes and a resistor is disclosed in the published European patent application 0 371 663, the resistor being formed by a metal silicide link placed horizontally outside the pad. Other similar protective structures including a resistor in an input and/or output path are disclosed in U.S. Pat. Nos. 5,808,343, 5,615,073, 5,196,913, 4,730,208 and 4,710,791.

SUMMARY

It is an object of the invention to provide a device for protecting a connection pad of an integrated circuit against excessive positive or negative voltages, the device presupposing no extra processing steps when fabricating the integrated circuit.

It is an object of the invention to provide a device for protecting a connection pad of an integrated circuit against excessive positive or negative voltages having a small parasitic capacitance and having a good tolerance of electric overstress.

It is another object of the invention to provide a connection pad of an integrated circuit which has ESD protection and has a minimum risk of causing latch-up of input/output transistors.

It is another object of the invention to provide a connection pad of an integrated circuit which is protected against ESDs and has a minimum risk of delamination and of damaging pn-junctions of ESD-circuits when exposed to forces incurred when actually making a bonding to the pad, such as wire-bonding.

It is another object of the invention to provide a connection pad of an integrated circuit which has a resistance connected in an input and/or output path and provided in a simple and space-saving way.

Thus, connecting pads such as wirebond pads or pads for "flip-chip" contacting for integrated circuits have protective diodes formed by first electrodes which are connected to the respective pad and which have shapes of relatively narrow strips extending at or along a portion of the periphery or edge line of the pad. The first electrodes have a first doping type and are located connected to or in regions, which have a second doping type opposite the first doping type and form the second electrodes of the diodes and which are intended to be connected to sources of constant potentials capable of absorbing high currents. The location of the first electrodes at the edges of the pads allows that all metal areas required for electrically connecting the first electrodes to the pad can also be located at the edges of the pads. Hence no metal layer beneath the central large portions of the pads Is required. The regions directly below the center portions of the pads can then be made relatively uniform containing e.g. most silicon oxide what reduces the risk of delamination. Also, no pn-junctions have to located beneath said center portions.

The narrow shape of the first electrodes results in a low capacitance of the first electrodes to the second, regions and to other electrically conducting regions of the circuit. The narrow shape also provides a predetermined electrical resistance per unit length resulting in a distribution of possible high currents over the length of the first electrodes. The narrow strips of the first electrodes can be located straightly below a marginal portion of the respective pad and they can also have some portions outside that region, which thus is then will be located below surface portions at the side of the pad. The narrow strips can in many cases be given a sufficient length by making the pads octagonal having angles of substantially 135°. The strip-shaped regions are continuous strips which advantageously should have as smooth a configuration as possible and they should thus have angles not smaller than substantially 135° in order to avoid too high electric field strengths.

Specifically, one of the strip-shaped regions is used for forming an electrical resistor in an input and/or output current path of the integrated semiconductor circuit, such a location of the resistor not requiring any extra space on the integrated circuit chip. The resistor is formed by a portion of a first doped region, all of this portion or even all of the first doped region being located straightly under the pad, particularly all of the portion and/or all of the first doped region being located under a marginal portion of the pad. The portion and/or the first doped region have preferably an elongated shape or a strip-shape with a longitudinal direction and are arranged so that electrical current passing the resistor has directions substantially perpendicular to the longitudinal direction. Then, in particular the length of and the width of the portion and/or of the first doped region can be selected to give the resistor a predetermined electrical resistance per unit length of the portion so that electrical current is distributed substantially uniformly over all of the length of the portion. The portion and/or the first doped region can advantageously have shape of a continuous strip extending in parallel to a portion of the edge of the pad. In the case where the portion and/or the first doped region have the shapes of strips, the strips preferably have corners or angles between connected portions of the strip which are at least substantially 135°.

In the preferred embodiment, the first doped region is also an electrode of a first diode protecting the integrated semiconductor circuit, the first diode being connected to the input and/or output path. The first doped region which then forms the first electrode of the first diode can then be doped to a first conductivity type and electrically connected to the pad, and a second electrode of the first diode is formed by a second doped region of a second conductivity type opposite the first conductivity type, the second doped region being a relatively large region horizontally surrounding but not underlying the first doped region. The first and second doped regions are a similar kind of regions, extending from a horizontal plane down to substantially the same depth and being the type of regions called "wells" or "tubs" having a relatively low doping and a low conductivity. Third and fourth doped regions can be located inside, at the surface of and doped to the same type as the first region but they have higher doping and thus a higher conductivity than the first region, the third and fourth doped regions working as contact areas of the resistor formed in the material of the first doped region between these contact areas.

The first, third and fourth regions are preferably all strip-shaped and extend in parallel to each other and thus have parallel longitudinal directions. The third doped region can then be a contact area of the first electrode of the first diode, the first electrode being the first doped region. In a practical embodiment the fourth doped region is located closer to the center of the pad than the third doped region, the fourth doped region thus being protected since the first diode which acts as a protective diode is formed mainly at the outer boundary between the first and second regions, the outer boundary being more distant of the center of the pad than the opposite inner boundary. This is due to the fact that the second region is preferably connected to a constant potential at a region at some distance of the pad. All doped regions preferably have boundaries which have corners or angles between connected portions of the respective boundary which are at least substantially 135° in order to reduce the risk of high localized electrical fields being created.

Generally also, a device for protecting an electrical connection pad of an integrated semiconductor circuit or chip against high and low voltages comprises a first well of a first conductivity type and a second well of a second conductivity type, the second conductivity type being opposite the first conductivity type, the first and second wells being formed at the surface of or in a substrate. A first conductive area of the second conductivity type is located in the first well for forming a first pn-junction and a second conductive area of the first conductivity type is located in the second well for forming a second pn-junction. The first and second conductive areas are electrically connected to the pad. A third well of the second conductivity type is located inside and is horizontally surrounded by the first well, which thus only encloses the third well at the vertical sides thereof and has no portion under the third well. The first conductive area is located inside the third well and acts as a contact area of the first pn-junction which is formed at the boundary between the first and third well.

Practically, the first conductivity type can be P-type and the second conductivity N-type, and then the doping producing the conductivity of the third well can substantially comprise phosphorous atoms and the doping producing the conductivity of the first conductive area can substantially comprise arsenic atoms.

The first and second wells can advantageously be located at the side of each other and each have portions located below substantially a half of the pad, the border line between the wells thus extending along a diameter of the pad or passing through a center of the pad.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

DETAILED DESCRIPTION

Figure 1:
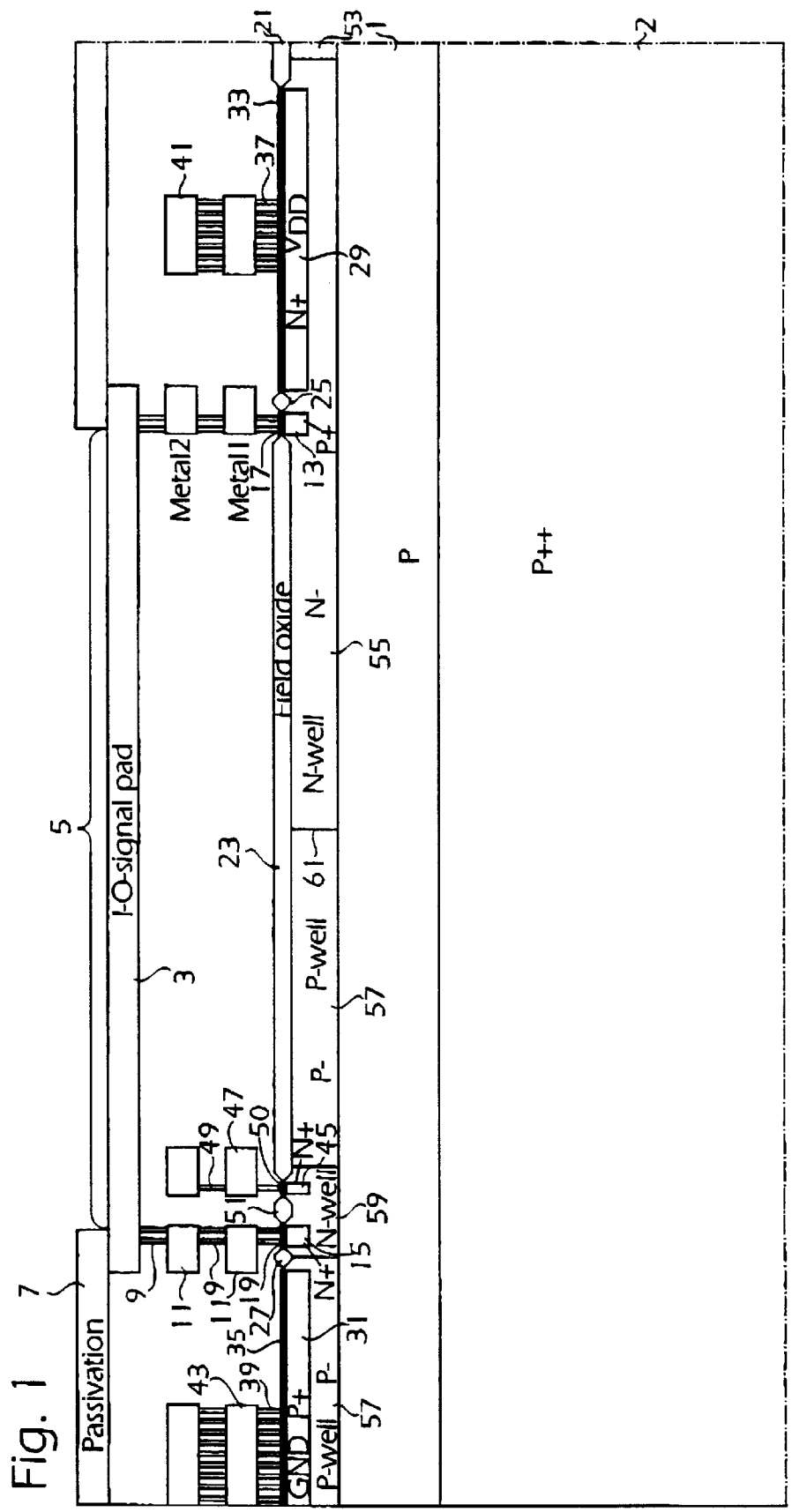
FIG. 1 is a sectional view of a portion of a semiconductor chip having a bonding pad provided with electrostatic discharge protection.

FIG. 1 is a schematic, partial sectional view of an integrated circuit chip multilayer structure made on top of a P-substrate 1 which only has a basic, very low doping. The substrate 1 has a bottom layer 2 which is type P++ and thus is a good electric conductor and can be connected to have a ground potential, for instance to a leadframe, not shown, giving all of the chip a bottom plane having a well defined ground potential what reduces the sensitivity of high-frequency signals to interference. An electrical connection pad 3 such as for wirebonding is part of a top metal layer and has a partly free upper surface area 5, the margin portions of the pad being covered by a passivating layer 7. The pad 3 has generally the shape of an octagon, which can be regular and has sides which form an angle of 135° with adjacent sides, see the top view of an integrated circuit chip in FIG. 3, the sectional view of FIG. 1 being taken along the line I—I in FIG. 3. The pad can also have other shapes such as the shape obtained from a regular octagon by making two opposite parallel sides longer or shorter or the shape of polygon having more than eight sides. In any case the angles between adjacent sides should not be smaller than substantially 135°. At the covered parts, i.e. at the margin portions, of the pad 3, the pad has electrical contact with underlying electrically conductive layers through a multitude of electrical contact plugs 9 and metal areas 11 patterned from intermediate metal layers, for example as illustrated from a first lower metal layer called Metal1 and a second intermediate metal layer called Metal2.

The contact plugs 9 e.g. have a square cross-section and are placed rather densely. The metal areas 11 and the contact plugs 9 are in the embodiment shown arranged straightly beneath a marginal portion of the pad 3, substantially beneath the portion thereof covered by the passivation layer 7, and they are in any case not located beneath the central portion of the pad. The undermost plugs 9 have electrical contact with strip shaped areas 13, 15 of an electrically well-conducting layer of varying doping types, this layer e.g. being an ion-implanted and/or diffused layer. The electrically conducting areas 13, 15 can have a titanium silicidation 17, 19 at their top surface to enhance their electrical contact with the undermost contacts plugs 9, but such surface layers for reducing the contact resistance are not necessary. The diffused or implanted areas 13, 15 have opposite doping types, P+ and N+ respectively, and they are doped to have a high electrical conductivity with a doping type selected so that these areas form diodes with adjacent and/or underlying areas or contacts to adjacent and/or underlying areas which form diodes, as will be described below. The various areas of the well-conducting, doped layer forming the electrically conducting areas 13. 15 and other areas are laterally defined by areas of a field oxide layer 21

Thus, straightly below the central free area 5 of the bonding pad 3 a field oxide area 23 is located. At the outer edges of the well-conducting, ion-implanted and/or diffused areas 13, 15 other narrow, strip-shaped outer field oxide areas 25, 27 are located, which thus have their inner edges located under the edges of the pad 3, a little displaced towards the center of the pad 3 and their outer edges for instance located approximately straightly below the edge of the pad 3. Further electrically well-conducting areas 29, 31 of the same layer produced by implanting and/or diffusing are also arranged which are isolated by the outer field oxide strip-areas 25, 27 from the electrically well-conductive areas 13, 15 and from each other and which serve as electrical contacts to regions thereunder. The further well-conducting areas 29, 31 can be located at some suitable place, and may not as shown in FIG. 1 be located directly at the side of the conductive areas 13, 15 only separated by the narrow field oxide strips 27, 27, see FIG. 3. The further well-conducting areas 29, 31 can have titanium silicidated areas 33, 35 on their top surfaces and have therethrough and through contact plugs 37, 39 contact with areas 41, 43 of the metal layers Metal1 and Metal2. The metal areas 41, 43 are intended to be connected to suitable constant potentials, as will be discussed below.

The titanium silicidated areas 17, 19 could advantageously cover only the central portions of the implanted, electrically conducting areas 13, 15, which portions are located directly below the contact plugs 9, so that there are narrow marginal portions of the implanted areas 13, 15, which are thus located at the field oxide areas 25, 27 and 23 and have no silicidation.

Another well-conducting strip-shaped area 45 of the same ion-implanted and/or diffused layer is located at and extends along one of the well-conducting strips 13, 15 and has the same doping. In the example shown this further well-conducting strip-area 45 is located at the well-conducting strip 15 and they are both doped to N+. Areas 47 of the two lower metal layers Metal1 and Metal2 are located above the further strip-shaped well-conducting area 45 and are connected thereto and to each other by contact plugs 49 and a silicide region 50. The topmost of the metal areas 47 is by a horizontal connection, not shown in FIG. 1, connected to input and/or output circuits of some active device, not shown, made in or on the same chip through prolongations of the respective metal area. A strip-shaped, narrow field-oxide area 51 separates the further well-conducting strip-area 45 of type N+ from the well-conducting area 15 of type N+.

Under the well-conducting areas 13, 15, 29, 31, 45 and the field oxide areas 23, 25, 27, 51 a layer 53 is located which can be an epitaxial layer and is doped to form weakly doped N-wells and P-wells 55, 57, 59, these regions having doping types denoted by N-, P- and N-respectively. The area of the layer 53 under the pad 3 is centrally divided by a flat vertical plane or horizontal line 61 separating a large N-well 55 from a large P-well 57. The first well-conducting strip-shaped area 13 of type P+ located below or at the edge of the pad is implanted and/or diffused in the respective large well 55 of type N- to form a first protective diode. The second well-conducting strip-shaped area 15 of type N+ located below or at the edge of the pad and the further well-conducting strip-shaped area 45 extending along it are implanted and/or diffused in a narrow, strip-shaped well 59 of type N- to form a protective resistor, the narrow N-well 59 being horizontally enclosed by the other large P-well 57. The second well-conducting strip-shaped area 15 forms with the other large P-well 57 a second protective diode. The other electrically conducting, implanted areas 29, 31 of type N+, P+ have the same doing type as the well, in which they are located, and serve to electrically contact the material of the well and to give it a well-defined electrical potential.

Figure 3:
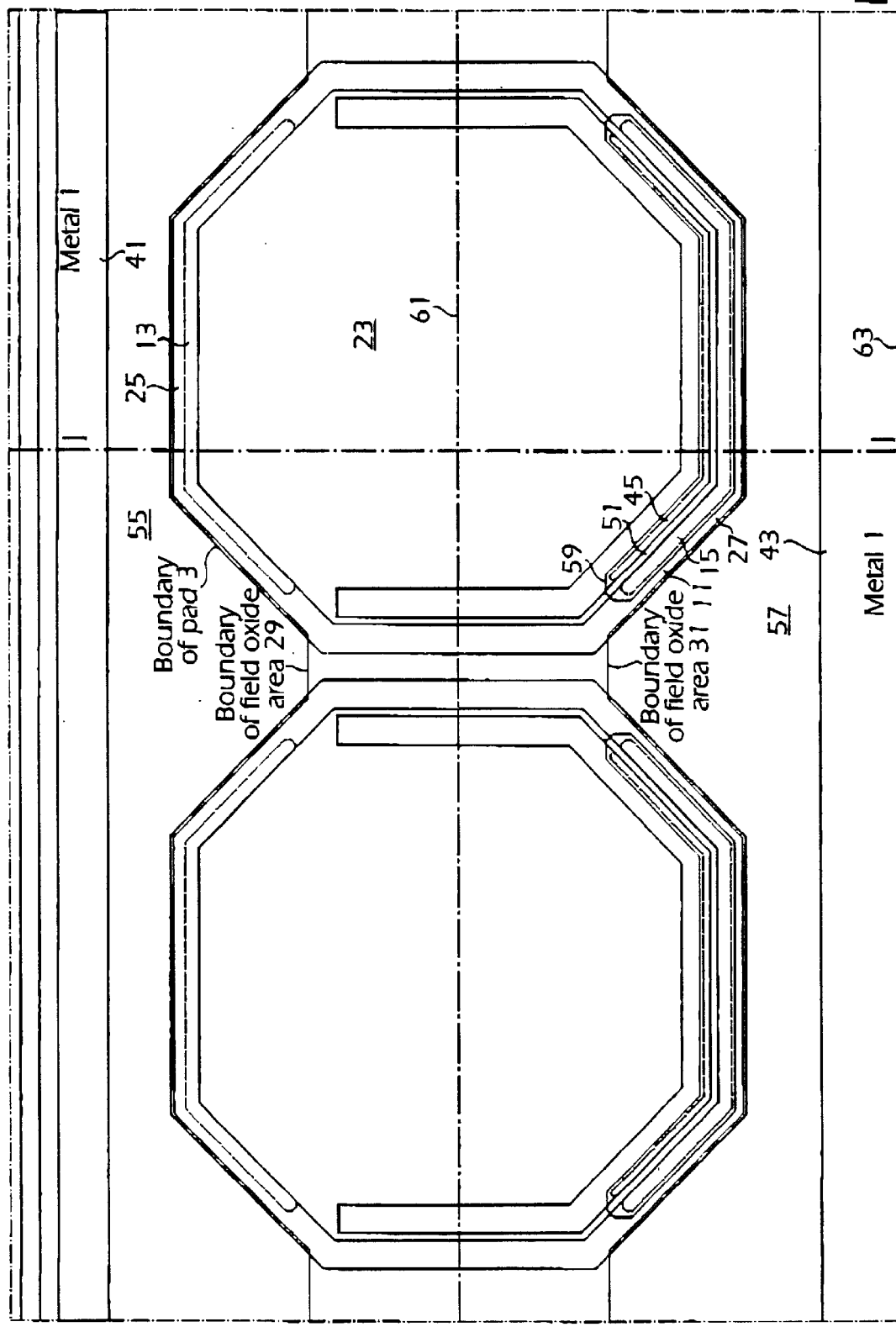
FIG. 3 is a plan view of the chip of FIG. 1 having all layers above a lower-most metal layer removed, the line I—I indicating the section of FIG. 1.

In FIG. 3 a view from above of two bonding pads located at each other is shown, the bonding pads having an octagon shape as mentioned above. A plurality of such bond pads can be placed in a row along the periphery of an integrated circuit chip. Each octagon has one side placed in parallel with and adjacent a side of the other octagon and the octagon shapes have their centers placed in the same separating plane 61 which is parallel to an edge 63 of the integrated circuit chip. Each octagon has one outer side parallel with and located near the edge 63 of the chip and one inner side also parallel with the edge but more distant thereof. As seen in FIG. 3, the first electrically well-conductive area 13 is a narrow strip of type P+ of a uniform width extending along the periphery of the respective pad 3, located a little inside the periphery and parallel thereto. The area 13 extends along the inner side of the octagon shape parallel to the chip edge and along the two sides connected to the inner side. However, it ends at some distance of the adjacent octagon shape. This electrically conductive area is located above the N-well 55 and forms with the material of the N-well the first protective diode having its forward-biased direction away from the pad 3. In the same N-well 55 is the conductive area 29 of type N+ located and it is supposed to be connected to a positive supply voltage $V_{DD}$, intended for energizing e.g. the active circuits such as field effect transistors of the chip. Thus, the electrical potential of the N-well 55 will effectively have this potential. The positive supply voltage $V_{DD}$ is normally not lower than the voltage of the pad 3 and thus the diode formed will be reverse-biased.

In the same way the second well-conductive strip-shaped area 15 is a narrow strip of type N+ of a uniform width extending along an opposite portion of the periphery of the pad 3 and has a shape, as seen from above, corresponding to a mirrored picture of the conductive area 13 of type P+. The well-conductive area 15 is located above or in the narrow N-well 59 and the N-well forms, as contacted by the well-conducting area 13, with the surrounding P-well 57 the second protective diode. In this P-well 57 the conductive area 31 of type P+ is located, which is supposed to be connected to ground potential and which also contacts the P-well 57, and thereby the P-well will have ground potential. Thus the second protective diode formed will be reverse-biased for normal potentials of the bonding pad 3.

The area 11 of the lowest metal layer Metal1 which is through contact plugs and areas of the intermediate metal layer Metal2 connected to the pad 3 is a closed strip of a uniform width extending along the periphery of the pad, the outer edge of the area 11 being located e.g. straightly under the pad periphery.

The further well-conducting strip-shaped area 45 is a very narrow strip of type N+ of a uniform width and it extends in parallel to the second well-conductive area 15 and has the same length. The area 47 of the lower metal layer Metal1 connected through plugs to the further well-conducting area 45 is a strip of a uniform width, e.g. having the same width as the closed ring 11 of the same layer Metal1. It extends in parallel to the closed ring but only at the outer straight portion of the closed strip which is located at outer side of octagon shape and at the two straight portions of the closed strip which are connected to the outer straight portion. The closed strip 11 and the area 47 are electrical contacts for an electric resistor formed by the material of the N-well 59, this resistor then being also strip-shaped distributing an electrical current flowing between the pad 3 and the active devices of the chip over its total length, the current then flowing substantially perpendicular to the longitudinal directions of the strip-shaped resistor. The resistor will also operate as one electrode of a diode, the other electrode of which being the surrounding P-well 57 and the underlying base P-layer 1.

Figures 2, 4:
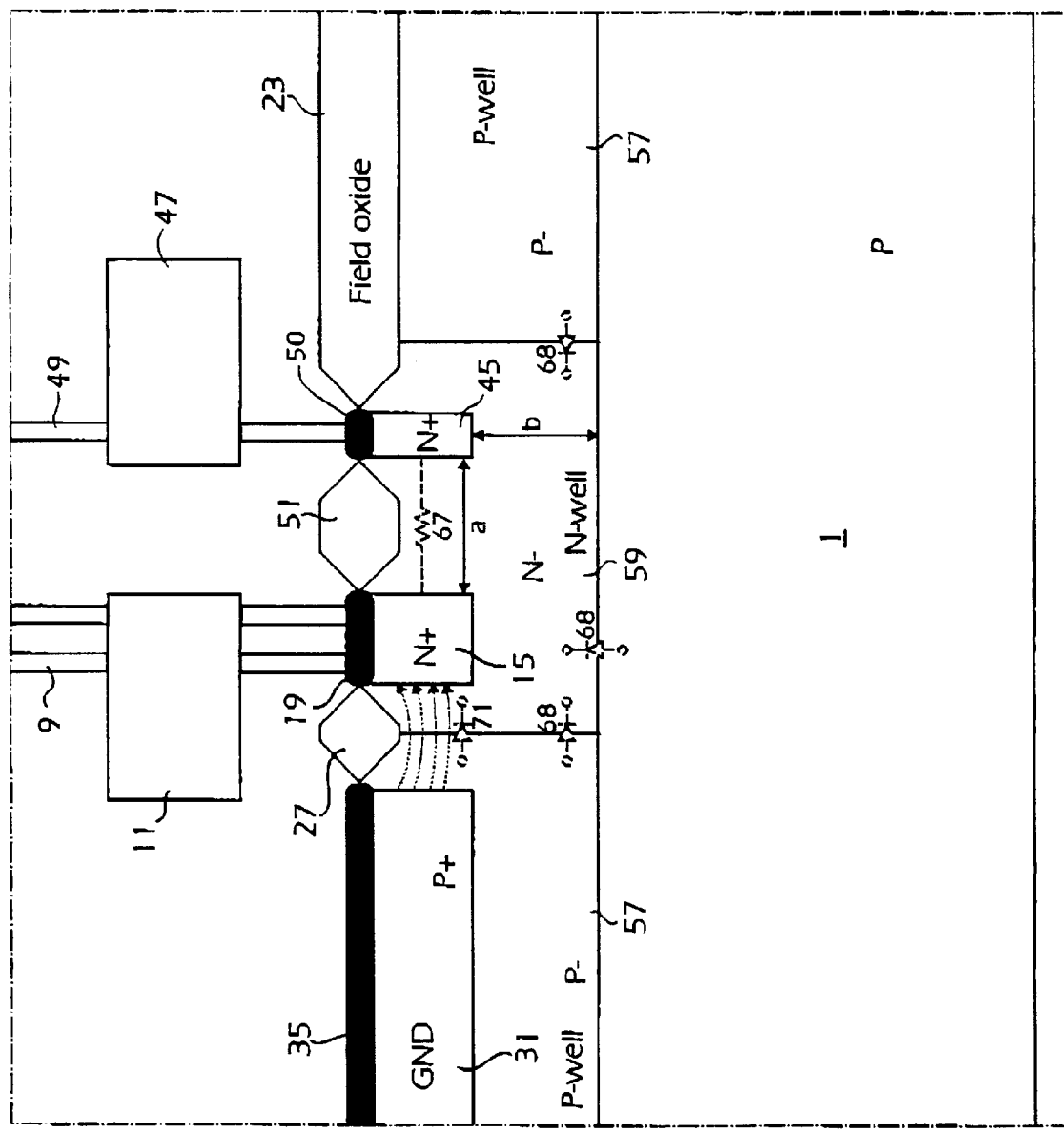
FIG. 2 is a principle circuit diagram illustrating the operation of the electrostatic discharge protection.
FIG. 4 is a picture in a large scale of a portion of the sectional view of FIG. 1.

An electric equivalent circuit diagram of the pad 3 also showing the shape of the pad 3 and the border plane 61 between the wells 55, 57 is illustrated in FIG. 2. The pad 3 is connected to active devices 65 including typically CMOS-transistors through the electrical protective resistor 67, as described above. The pad 3 is also connected to the positive supply voltage $V_{DD}$ through the first protective diode 69 and to ground potential through the second protective diode 71. The first diode 69 connected to the supply voltage is formed by the electrically conducting area 13 of type P+ and the N-well 55, the N-well being connected to the supply voltage through the electrically well-conducting area 29 and the contact plugs 37 and the areas 41 of the two lower metal layers, see FIG. 1. The first diode is normally reverse-biased, since the potential of the pad 3 will not be higher than the positive supply voltage. The second diode 71 connected to ground is formed by the strip-shaped N-well 59 and the surrounding P-well 57, the P-well being connected to ground potential through the electrically well-conducting region 31, the contact plugs 39 and the areas 43 of the lower metal layers, see FIG. 1. The second diode is also normally reverse-biased, since the potential of the pad 3 is normally not lower than ground potential.

By arranging a silicidation only on the central longitudinal portions of the electrically conducting areas 13, 15, the silicidation which has a very good electrical conductivity will be located at some distance from the pn-junctions of the diodes 69, 71 formed and will not be in electrical contact with the edge regions of the electrically conducting areas 13, 15 at the field oxide where the crystal structure of the silicon can be disturbed to form a less efficient pn-junction with the material of the respective well at these edges. This could make the protection diodes more stable.

The resistor 67 forms an electrode of a diode 68, the other electrode of which is the surrounding P-well 57 and the base layer 1 which are connected to ground. This diode is also normally reverse-biased.

When a positive voltage higher than the sum of $V_{DD}$ and the forward voltage drop over one of the protective diodes, such as typically about 0.7 V, is applied to the pad 3, the first protective diode 69 on the supply voltage side will start to conduct and the electrical current flows into the supply voltage source, not shown. When a negative voltage smaller than the negative of the forward voltage drop of a diode is applied to the signal pad 3, the second protective diode 71 on the ground potential side will start to be conducting and the electrical current will flow from ground to the pad. Provided that the diodes 69, 71 can carry the current without being overheated all excessive voltages applied to the pad will be handled, not flowing into or from the active devices 65 which are thus protected.

Thus the protective diodes 69, 71 should have a suitably adapted inner forward resistance, which could have a rather low value but still a not too low value. This resistance is inversely proportional to the area of the diodes, e.g. of the electrically conductive region 13. This area is seen in the top view of FIG. 3 and is made to be small since the electrically conductive regions 13, 15 and the strip-shaped well 59 have the shapes of narrow strips below the border of the signal pad 3. The small area results in a low capacitance of the reverse-biased diodes in the normal operating case what is essential when using the pad 3 to conduct high-frequency currents to and from an integrated circuit.

When one of the protective diodes 69, 71 is actually used for protecting the connected integrated circuit, a large electrical current can flow through the diode. This large current should then have a sufficient geometric cross-sectional area over which it can be distributed. This is achieved by designing, as has already been described, the electrically conducting areas 13, 15 and the well 59 as strips and making the strips sufficiently long.

The fact that the areas 13, 59 of the diodes, which are electrically connected to the pads, are strip-shaped will also allow these areas to be located at some distance of possible output/input transistors, not shown, located on the same chip. Such transistors contain pn-junctions which together with the protective diodes 69, 71 form thyristor structures. When thus a sufficient, excessive voltage is applied to a contact pad 3, this could cause a latch-up of the thyristor making the pn-junction of the transistor be conductive, what would make the output/input circuit having the pn-junction of the thyristor being inoperable until the supply voltage is interrupted. The distance allowed by the strip-shape will give a resistance of the thyristor structure which will in most cases prevent such latch-up phenomena.

The portion of the pad structure which includes the resistor 67 is seen in more detail in FIG. 4, the vertical dimensions being exaggerated in relation to the horizontal dimensions, this also being true of FIG. 1. The resistor has contact areas formed by the well-conducting areas 15, which have adjacent parallel sides located at a uniform distance "a" of each other. When the integrated circuit including the pad is used, an electrical current will, for input/output signals, flow substantially perpendicularly to the adjacent parallel sides and be distributed substantially uniformly over the horizontal length of the sides. Also, in FIG. 4 the current is indicated by arrows when the protective diode 71 is effective for a large negative ESD-pulse being applied to the pad. It appears that the distance "a" should always be equal to or larger than the distance "b" of the bottom of the well-conductive areas 15, 45 to the bottom of the N-well 59 and thus to the surface of the underlying P-layer 1. If this is not true, there is a risk for a break-through the resistor region, and thus that an ESD-pulse can reach the input/output path, due to the fact that the current from the region 45 can flow to the region 15 instead of flowing to the basic layer 1, which could be made to have a negative potential obtained from the P-doped regions 31 and 57.

There are also other advantages of placing the well-conducting area 15 of type N+ inside an N-well more than the possibility of obtaining a distributed input/output resistor. Usually, the well-conducting areas N-areas are doped with arsenic As and the N-wells with phosphorous P. The large arsenic atoms will not easily move in the annealing process required after an implantation of arsenic. The phosphorous atoms move considerably more easily and will then make the sharp corners of the arsenic regions more "round", this reducing the local electrical fields at the arsenic area and thereby the risk of a break-through. Furthermore, the contact plugs 9, 49 can carry very large currents and then heat is generated, in particular in the contact area at the well-conducting areas 15, 45 of type N+. Then there is a risk of "spiking", i.e. that the contact plugs ordinarily made from tungsten W are melted to flow down through said well-conducting areas into the underlying material. Since this material now is also a N-material, in the N-well 59, this will not effectively influence the operation of the pad structure and its protective devices.

The structure described above allows a very dense arrangement of the bond pads 3, see in particular FIG. 3. The protective diodes formed at the region 13 and the well 59 end at relatively large distance of the neighbouring pad and in particular of its corresponding diodes. This is due to the fact that the region 13 and the well 59 only extend at a portion of the inner and outer edge of the respective pad.

The integrated circuit and the input/output structures thereof as described above can be made using various semiconductor manufacturing or processing methods. For instance processing schemes not using silicidation for increasing the electrical contact can have the same protective input/output devices. The integrated circuits can be MOSFET or CMOS type, bipolar type, combined or other similar types using different kinds of substrates and substrate structures.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

What is claimed is:

1. An electrical connection pad structure for an integrated semiconductor circuit, the electrical connection pad structure comprising a pad connected through a resistor to an input and/or output path of the integrated semiconductor circuit, wherein the electrical connection pad structure includes a first doped region and the resistor is formed by a portion of the first doped region, all of said portion being located under the pad.

2. The electrical connection pad structure of claim 1, wherein all of said portion is located under a marginal portion of the pad.

3. The electrical connection pad structure of claim 1, wherein said portion has an elongated shape with a longitudinal direction, electrical current passing the resistor having directions substantially perpendicular to said longitudinal direction.

4. The electrical connection pad structure of claim 3, wherein the length of and the width of said portion are selected to give the resistor a predetermined electrical resistance per unit length of said portion in order to distribute electrical current substantially uniformly over all of the length of said portion.

5. The electrical connection pad structure of claim 1, wherein said portion has a shape of a continuous strip extending in parallel to a portion of an edge of the pad.

6. The electrical connection pad structure of claim 1, wherein said portion has a shape of a strip, the strip having corners or angles between connected portions of the strip which are at least substantially 135°.

7. The electrical connection pad structure of claim 1, wherein all of the first doped region is located under the pad.

8. The electrical connection pad structure of claim 1, wherein all of the first doped region is located under a marginal portion of the pad.

9. The electrical connection pad structure of claim 1, wherein the first doped region has a shape of a continuous strip extending in parallel to a portion of an edge of the pad.

10. The electrical connection pad structure of claim 1, wherein the first doped region has a shape of a strip, the strip having corners or angles between connected portions of the strip which are at least substantially 135°.

11. The electrical connection pad structure of clam 1, wherein the first doped region is an electrode of a first diode protecting the integrated semiconductor circuit and connected to the input and/or output path.

12. The electrical connection pad structure of claim 11, wherein the first doped region forming the first electrode of the first diode is doped to a first conductivity type and is electrically connected to the pad, the electrical connection pad structure further comprising a second doped region of a second conductivity type opposite the first conductivity type, the second doped region horizontally surrounding the first doped region and not underlying the first doped region, a second electrode of the first diode being formed by the second doped region.

13. The electrical connection pad structure of claim 1, further comprising third and fourth doped regions located in and doped to the same type as the first region but having a higher electrical conductivity than the first region, the third and fourth doped regions being contact areas of the resistor.

14. The electrical connection pad structure of claim 13, wherein the first, third and fourth regions have shapes of strips and have longitudinal directions parallel to each other.

15. The electrical connection pad structure of claim 13, wherein the third doped region is a contact area of a first electrode of a first diode, the first electrode comprising the first doped region.

16. The electrical connection pad structure of claim 13, wherein the fourth doped region is located closer to a center of the pad than the third doped region.

17. The electrical connection pad structure of claim 1, wherein the pad has a shape of an octagon having all of its angles substantially equal to 135° or all of its angles substantially at least 135°.

18. The electrical connection pad structure of claim 1, wherein all doped regions have boundaries which have corners or angles between connected portions of the respective boundary which are at least substantially 135°.

19. A device for protecting an electrical connection pad against high and low voltages, the device comprising:
   a substrate,
   a first well of a first conductivity type and a second well of a second conductivity type, the second conductivity type being opposite the first conductivity type, the first and second wells being formed on or in the substrate,
   a first conductive area of the second conductivity type in the first well for forming a first pn-junction and a second conductive area of the first conductivity type in the second well for forming a second pn-junction, the first and second conductive areas being connected to the electrical connection pad,
   a third well of the second conductivity type located inside and surrounded by the first well, the first well not underlying the third well, the first conductive area being located inside the third well and acting as a contact area of the first pn-junction formed at a boundary between the first and third wells.

20. The device of claim 19, wherein the first conductivity type is P-type and the second conductivity is N-type.

21. The device of claim 20, wherein a doping of the third well comprises substantially phosphorous atoms and a doping of the first conductive area comprises substantially arsenic atoms.

22. The device of claim 20, wherein the third well comprises implanted and/or diffused phosphorous atoms and the first conductive area comprises implanted and/or diffused arsenic atoms.

23. The device of claim 19, wherein the third well comprises a strip located at an edge of the electrical connection pad.

24. The device of claim 23, wherein the strip is located straightly below the electrical connection pad.

25. The device of claim 19, wherein the first and second conductive areas are relatively narrow strips located at an edge of the electrical connection pad.

26. The device of claim 25, wherein the relatively narrow strips are located straightly below the electrical connection pad.

27. The device of claim 19, wherein the first and second wells are located at the side of each other and each are located below substantially a half of the electrical connection pad, a border line or border plane between the wells passing through a center of the electrical connection pad.

28. The device of claim 19, wherein the first and second wells are arranged to be connected to constant potentials.

29. The device of claim 19, wherein the first and second wells are arranged to be connected to a constant voltage provided by a voltage supply source or to a ground potential.

* * * * *